(12) United States Patent
Nishiyama et al.

(10) Patent No.: US 7,944,037 B2
(45) Date of Patent: *May 17, 2011

(54) SEMICONDUCTOR DEVICE AND SEMICONDUCTOR MEMORY DEVICE

(75) Inventors: Taku Nishiyama, Yokohama (JP); Tetsuya Yamamoto, Yokohama (JP); Kiyokazu Okada, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/762,401

(22) Filed: Apr. 19, 2010

(65) Prior Publication Data

US 2010/0200976 A1 Aug. 12, 2010

Related U.S. Application Data

(63) Continuation of application No. 12/238,983, filed on Sep. 26, 2008, now Pat. No. 7,732,908.

(30) Foreign Application Priority Data

Sep. 28, 2007 (JP) ................................. 2007-255633

(51) Int. Cl.
 *H01L 23/02* (2006.01)
(52) U.S. Cl. ........................................ 257/686; 257/777
(58) Field of Classification Search .................. 257/686, 257/777, 784, 723, 724
See application file for complete search history.

(56) References Cited

U.S. PATENT DOCUMENTS

| 6,538,331 | B2 | 3/2003 | Masuda et al. | |
| 6,686,663 | B2 | 2/2004 | Masuda et al. | |
| 7,061,105 | B2 | 6/2006 | Masuda et al. | |
| 7,732,908 | B2 * | 6/2010 | Nishiyama et al. | 257/686 |
| 2005/0116331 | A1 | 6/2005 | Tsunozaki | |
| 2007/0102801 | A1 | 5/2007 | Ishida et al. | |
| 2007/0170573 | A1 * | 7/2007 | Kuroda et al. | 257/686 |
| 2007/0284718 | A1 * | 12/2007 | Ha et al. | 257/686 |
| 2007/0290319 | A1 * | 12/2007 | Kim | 257/686 |
| 2008/0073770 | A1 * | 3/2008 | Yee et al. | 257/686 |
| 2008/0105965 | A1 * | 5/2008 | Song et al. | 257/686 |
| 2008/0169549 | A1 * | 7/2008 | Carson | 257/686 |
| 2008/0316696 | A1 | 12/2008 | Nishiyama et al. | |

FOREIGN PATENT DOCUMENTS

| JP | 2001-217383 | 8/2001 |
| JP | 2005-302871 | 10/2005 |

* cited by examiner

*Primary Examiner* — S. V Clark
(74) *Attorney, Agent, or Firm* — Oblon, Spivak, McClelland, Maier & Neustadt, L.L.P.

(57) ABSTRACT

A plurality of semiconductor elements configuring a first element group are stacked in a step-like shape on a wiring board. A plurality of semiconductor elements configuring a second element group are stacked in a step-like shape on the first element group toward a direction opposite to the stepped direction of the first element group. The semiconductor elements are electrically connected to connection pads of the wiring board through metallic wires. Among the plurality of semiconductor elements configuring the second element group, the lowermost semiconductor element has a thickness larger than those of the other semiconductor elements.

16 Claims, 10 Drawing Sheets

SEMICONDUCTOR DEVICE AND SEMICONDUCTOR MEMORY DEVICE

CROSS-REFERENCE TO RELATED APPLICATIONS

This application is a continuation of and claims the benefit of priority under 35 U.S.C. §120 from U.S. Ser. No. 12/238,983 filed Sep. 26, 2008, and claims the benefit of priority under 35 U.S.C. §119 from Japanese Patent Application No. 2007-255633 filed Sep. 28, 2007; the entire contents of each of which are incorporated herein by reference.

BACKGROUND OF INVENTION

1. Field of the Invention

The present invention relates to a semiconductor device and a semiconductor memory device.

2. Description of the Related Art

A semiconductor memory card having a NAND-type flash memory and the like therein is being downsized and provided with high capacity rapidly. For realization of a downsized memory card, semiconductor elements such as a memory element, a controller element and the like are mounted in a stacked form on a wiring board. The electrode pads of the semiconductor elements are electrically connected to the connection pads of the wiring board by wire bonding. Besides, the memory elements are also stacked into multiple layers on the wiring board to provide a high capacity memory card.

There is a tendency that the number of memory elements stacked is increased. It is being studied to stack the memory elements into four, eight or more layers depending on the storage capacity of the memory card. It is being studied to stack the plural semiconductor elements in a step-like shape to expose the electrode pads of the semiconductor elements having, for example, a single short-side pad structure to perform wire bonding of the multilayered semiconductor elements (memory elements) (see JP-A 2001-217383 (KOKAI), JP-A 2005-302871 (KOKAI)).

A length in the stepped direction becomes long with the increase in the number of stacked semiconductor elements, and an occupied area (projected area of all elements) of the semiconductor elements relative to the wiring board increases. Since the size of the memory card is defined, a pad arrangement region of the wiring board is restricted with the increase in the occupied area of the semiconductor elements. Therefore, it becomes difficult to secure a pad arrangement region which is connected to memory elements and a controller element.

SUMMARY OF THE INVENTION

A semiconductor device according to an aspect of the present invention comprises: a wiring board having a first surface provided with an element mounting section and connection pads, and a second surface on a side opposite to the first surface; a first element group including a plurality of semiconductor elements with electrode pads arranged along one outline side, the semiconductor elements being stacked in a step-like shape on the element mounting section of the wiring board with the outline sides directed to the same direction and the electrode pads exposed; a second element group having a plurality of semiconductor elements with electrode pads arranged along one outline side, the semiconductor elements being stacked in a step-like shape on the first element group in a direction opposite to the stepped direction of the first element group with the outline sides directed to the same direction and the electrode pads exposed; first metallic wires electrically connecting the electrode pads of the semiconductor elements configuring the first element group and the connection pads of the wiring board; second metallic wires electrically connecting the electrode pads of the semiconductor elements configuring the second element group and the connection pads of the wiring board; and a sealing resin layer formed on the first surface of the wiring board to seal the first and second element groups together with the first and second metallic wires, wherein the lowermost semiconductor element among the semiconductor elements configuring the second element group has a thickness larger than those of the other semiconductor elements among the semiconductor elements configuring the second element group.

A semiconductor device according to another aspect of the present invention comprises: a wiring board having a first surface provided with an element mounting section and connection pads, and a second surface on a side opposite to the first surface; a first element group having a plurality of semiconductor elements with electrode pads arranged along one outline side, the semiconductor elements being stacked in a step-like shape on the element mounting section of the wiring board with the outline sides directed to the same direction and the electrode pads exposed; a second element group having a plurality of semiconductor elements with electrode pads arranged along one outline side, the semiconductor elements being stacked in a step-like shape on the first element group with the outline sides directed to the same direction and the electrode pads exposed; first metallic wires electrically connecting the electrode pads of the semiconductor elements configuring the first element group and the connection pads of the wiring board; second metallic wires electrically connecting the electrode pads of the semiconductor elements configuring the second element group and the connection pads of the wiring board; and a sealing resin layer formed on the first surface of the wiring board to seal the first and second element groups together with the first and second metallic wires, wherein the lowermost semiconductor element among the semiconductor elements configuring the second element group has a hollow portion below the electrode pads, and an insulating resin is filled in the hollow portion.

A semiconductor memory device according to an aspect of the present invention comprises: a wiring board having a first surface provided with an element mounting section and connection pads, and a second surface on a side opposite to the first surface; external connection terminals formed on the second surface of the wiring board; a memory element group including a plurality of semiconductor memory elements with electrode pads arranged along one outline side, the semiconductor memory elements being stacked in a step-like shape on the element mounting section of the wiring board with the outline sides directed to the same direction and the electrode pads exposed; a controller element, stacked on the memory element group, having first electrode pads arranged along a first outline side and second electrode pads arranged along a second outline side orthogonal to the first outline side; a relay element stacked on the memory element group; first metallic wires electrically connecting the electrode pads of the semiconductor memory elements and the connection pads of the wiring board; second metallic wires electrically connecting the first electrode pads of the controller element and the connection pads of the wiring board; third metallic wires electrically connecting the second electrode pads of the controller element and the connection pads of the wiring board via the relay element; and a sealing resin layer formed on the first surface of the wiring board to seal the memory element group, the controller element and the relay element together with the first, second and third metallic wires.

A semiconductor memory device according to another aspect of the present invention comprises: a wiring board having a first surface provided with an element mounting section and connection pads, and a second surface on a side opposite to the first surface; external connection terminals formed on the second surface of the wiring board; a memory element group including a plurality of semiconductor memory elements with electrode pads arranged along one outline side, the semiconductor memory elements being stacked in a step-like shape on the element mounting section of the wiring board with the outline sides directed to the same direction and the electrode pads exposed; a controller element, arranged below an overhang portion of the semiconductor memory elements stacked in the step-like shape, flip-chip connecting to the connection pads of the wiring board; metallic wires electrically connecting the electrode pads of the semiconductor memory elements and the connection pads of the wiring board; and a sealing resin layer formed on the first surface of the wiring board to seal the memory element group and the controller element together with the metallic wires.

DETAILED DESCRIPTION OF THE INVENTIONS

Modes of conducting the present invention will be described below with reference to the drawings.

A semiconductor memory device (semiconductor device) according to a first embodiment of the present invention is described below with reference to FIG. 1 and FIG. 2.

Figure 1:
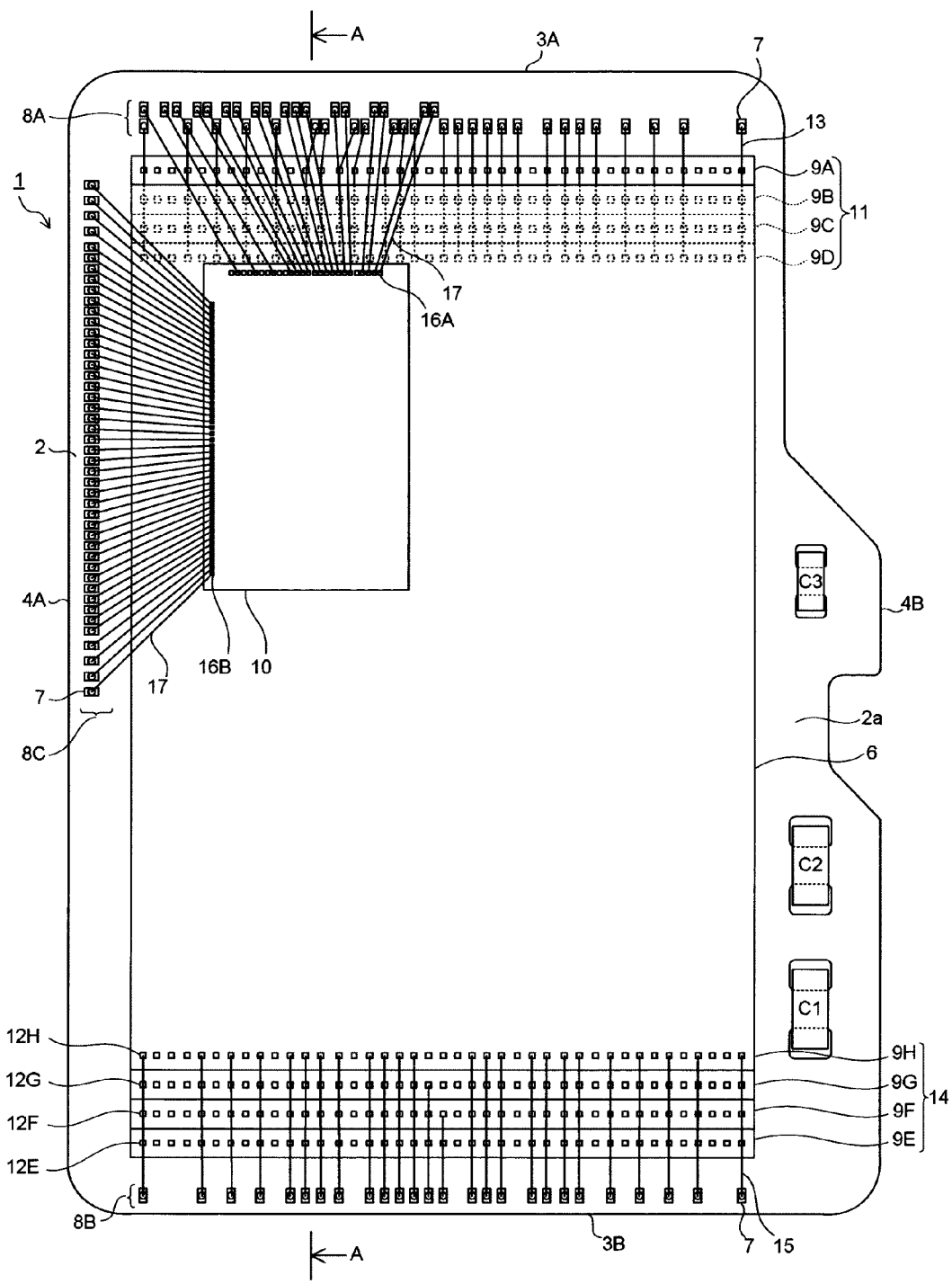
FIG. 1 is a plan view showing a semiconductor memory device according to a first embodiment of the present invention.
Figure 2:
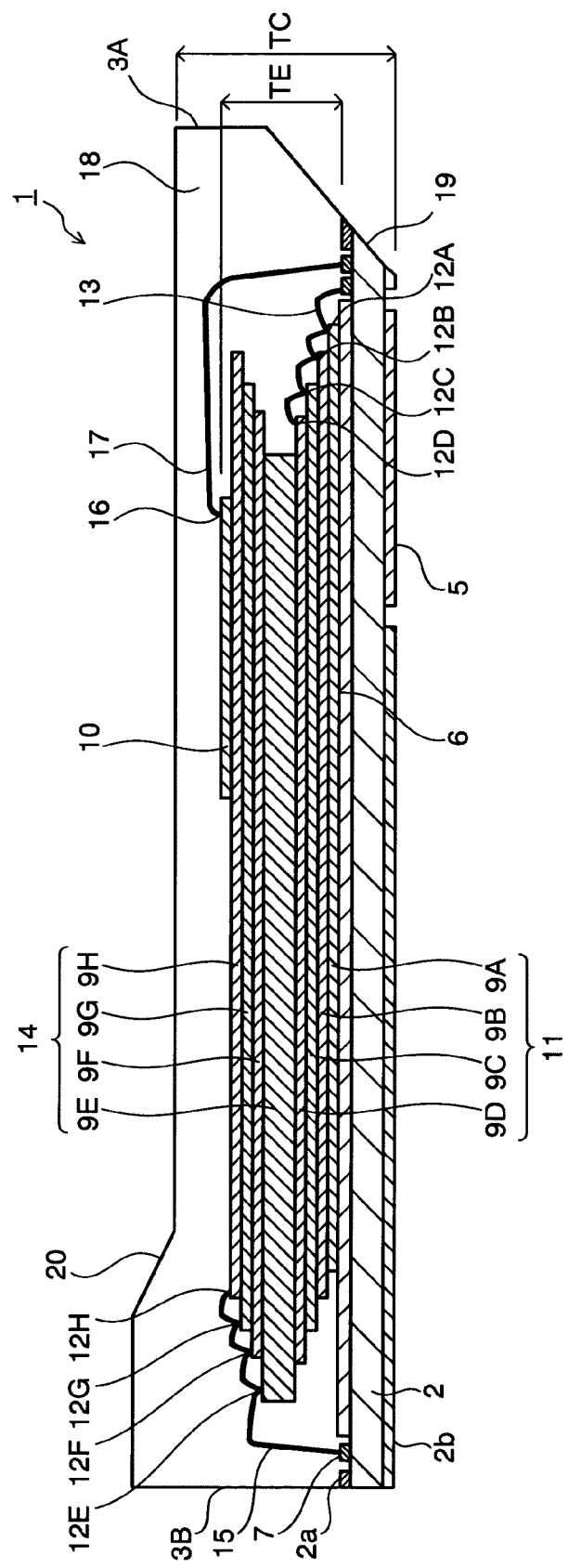
FIG. 2 is a sectional view taken along line A-A of FIG. 1.

FIG. 1 is a plan view showing a semiconductor memory device (semiconductor device) according to the first embodiment, and FIG. 2 is a sectional view (sectional view cut in a long side direction) taken along line A-A of FIG. 1. A semiconductor memory device 1 shown in the drawings configures a semiconductor memory card and is solely used as, for example, a micro SD™ card of the SD standard.

The semiconductor memory device 1 is provided with a wiring board 2 which serves as an element-mounting substrate and a terminal-forming substrate. For example, the wiring board 2 has wiring networks provided within and on the front surface of an insulating resin substrate, and specifically a printed circuit board using a glass-epoxy resin, a BT resin (bismaleimide triazine resin) or the like is applied. The wiring board 2 has a first surface 2a which becomes an element-mounted surface and a second surface 2b which becomes a terminal formation surface. First through third chip capacitors C1 to C3 are mounted on the first surface 2a of the wiring board 2.

The wiring board 2 has a substantially rectangular profile. One short side 3A of the wiring board 2 corresponds to a leading end of a memory card when it is inserted into a card slot. The other short side 3B corresponds to the rear end part of the memory card. One long side 4A of the wiring board 2 has a linear shape, and the other long side 4B has a cutout portion and a recess portion to indicate the forward and backward direction and the front and rear surface direction of the memory card. Each corner of the wiring board 2 has a curved shape (R shape).

External connection terminals 5 which become an input/output terminal of the memory card are formed on the second surface 2b of the wiring board 2. The external connection terminals 5 are formed of metal layer which is formed by electrolytic plating or the like. The second surface 2b of the wiring board 2 corresponds to the front surface of the memory card. Besides, a second wiring network (not shown) is provided in a region on the second surface 2b of the wiring board 2 excepting a region where the external connection terminal 5 is formed. The second wiring network has test pads of the memory card. The second wiring network provided on the second surface 2b is covered with an insulating layer (not shown) using an insulating adhesive seal or adhesive tape.

The first surface 2a of the wiring board 2 has an element mounting section 6 and a first wiring network including connection pads 7 which become bonding portions at the time of wire bonding. The first surface 2a of the wiring board 2 corresponds to the back surface of the memory card. The first wiring network having the connection pads 7 is electrically connected to the external connection terminals 5 and the second wiring network through unshown internal wirings (such as through holes) of the wiring board 2. The connection pads 7 are arranged on a first pad region 8A along the short side 3A, a second pad region 8B along the short side 3B and a third pad region 8C along the long side 4A.

Plural semiconductor memory elements (semiconductor elements) 9 are mounted by stacking on the element mounting section 6 of the first surface 2a of the wiring board 2. For example, a NAND-type flash memory is used as the semiconductor memory elements 9. A controller element 10 is stacked on the semiconductor memory elements 9. The controller element 10 selects a semiconductor memory element to write and read data to and from the plural semiconductor memory elements 9, writes data into the selected semiconductor memory element 9 or reads data which is stored in the selected semiconductor memory element 9.

A first semiconductor memory element 9A, a second semiconductor memory element 9B, a third semiconductor memory element 9C and a fourth semiconductor memory element 9D which configure a first element group (memory element group) 11 are sequentially stacked on the first surface 2a of the wiring board 2. The first through fourth semiconductor memory elements 9A to 9D have the same rectangular shape and are provided with electrode pads 12A to 12D. The first through fourth electrode pads 12A to 12D are arranged along one outline sides, specifically one short sides, of the first through fourth semiconductor memory elements 9A to 9D. The first through fourth semiconductor memory elements 9A to 9D have a single short-side pad structure.

The first semiconductor memory element 9A is adhered onto the element mounting section 6 of the wiring board 2 via an adhesive layer (not shown) with an electrode formation surface, on which the first electrode pads 12A are formed, directed upward. For the adhesive layer, a die attach film (adhesive agent film) which is mainly composed of a general polyimide resin, epoxy resin, acrylic resin or the like is used. The adhesive layer of the other semiconductor memory elements is also formed of the same material. The first semiconductor memory element 9A is arranged with a pad arrangement side (one short side) directed toward the short side 3A of the wiring board 2. In other words, the first semiconductor memory element 9A is arranged to position the electrode pads 12A near the first pad region 8A of the wiring board 2.

The second semiconductor memory element 9B is adhered onto the first semiconductor memory element 9A via an adhesive layer (not shown) with an electrode formation surface, on which the second electrode pads 12B are formed, directed upward and the first electrode pads 12A exposed. Similarly, the third semiconductor memory element 9C is adhered onto the second semiconductor memory element 9B and the fourth semiconductor memory element 9D is adhered onto the third semiconductor memory element 9C via an adhesive layer (not shown). The second through fourth semiconductor memory elements 9B to 9D are sequentially stacked in a step-like shape on the first semiconductor memory element 9A with the pad arrangement sides directed to the same direction as the first semiconductor memory element 9A and the electrode pads 12 of the lower semiconductor memory element 9 exposed.

The first through fourth semiconductor memory elements 9A to 9D are stacked in a step-like shape with the respective pad arrangement sides directed to the same direction, the long sides aligned and the short sides displaced in the direction of the long sides so as to expose the electrode pads 12 of the lower semiconductor memory elements 9. Therefore, the electrode pads 12A to 12D of the first through fourth semiconductor memory elements 9A to 9D are positioned in a state exposed upward near the first pad region 8A. The electrode pads 12A to 12D of the first through fourth semiconductor memory elements 9A to 9D are electrically connected to the connection pads 7 which are arranged on the first pad region 8A through first metallic wires 13.

When the first through fourth electrode pads 12A to 12D have the same electric properties and signal characteristics, they can be connected sequentially by the first metallic wires 13. In other words, the fourth electrode pads 12D and the third electrode pads 12C are connected by the metallic wires 13. Similarly, the metallic wires 13 are used to connect between the third electrode pads 12C and the second electrode pads 12B and between the second electrode pads 12B and the first electrode pads 12A. Lastly, the first electrode pads 12A and the connection pads 7 are connected by the metallic wires 13. Wire bonding of the individual pads may be conducted independently or they may be connected sequentially by a single metallic wire.

A fifth semiconductor memory element 9E, a sixth semiconductor memory element 9F, a seventh semiconductor memory element 9G and an eighth semiconductor memory element 9H which configure a second element group (second memory element group) 14 are sequentially stacked on the first element group 11. The fifth through eighth semiconductor memory elements 9E to 9H have the same rectangular shape and respectively have electrode pads 12E to 12H. The fifth through eighth electrode pads 12E to 12H are arranged on one sides, specifically one short sides, of the contours of the fifth through eighth semiconductor memory elements 9E to 9H. The fifth through eighth semiconductor memory elements 9E to 9H have a single short-side pad structure.

The fifth semiconductor memory element 9E is adhered onto the fourth semiconductor memory element 9D which is positioned on the top of the first element group 11 via an adhesive layer (not shown) with an electrode formation surface, on which the fifth electrode pads 12E are formed, directed upward. The fifth semiconductor memory element 9E is stacked to be displaced in the direction of the long side so as to expose the fourth electrode pads 12D. The fifth semiconductor memory element 9E is arranged with a pad arrangement side directed toward the short side 313 of the wiring board 2. The fifth semiconductor memory element 9E is arranged with the pad arrangement side directed to a direction opposite to the first semiconductor memory element 9A to position the electrode pads 12E near the second pad region 8B of the wiring board 2.

The sixth semiconductor memory element 9F is adhered onto the fifth semiconductor memory element 9E via an adhesive layer (not shown) with an electrode formation surface, on which the sixth electrode pads 12F are formed, directed upward and the fifth electrode pads 12E exposed. Similarly, the seventh semiconductor memory element 9G is adhered onto the sixth semiconductor memory element 9F and the eighth semiconductor memory element 9H is adhered onto the seventh semiconductor memory element 9G via an adhesive layer (not shown). The sixth through eighth semiconductor memory elements 9F to 9H are sequentially stacked in a step-like shape on the fifth semiconductor memory element 9E with the pad arrangement sides directed to the same direction as the fifth semiconductor memory element 9E and the electrode pads 12 of the lower semiconductor memory element 9 exposed.

The second element group 14 is stacked in a step-like shape with the pad arrangement sides directed to a direction opposite to the first element group 11 and a direction opposite to the stepped direction (direction toward the upper level of the elements stacked in the step-like shape) of the first element group 11. In other words, the fifth through eighth semiconductor memory elements 9E to 9H are stacked in the step-like shape with their pad arrangement sides directed to a direction opposite to the first element group 11, their long sides aligned, and the short sides displaced in a direction opposite to the first element group 11 to expose the electrode pads 12 of the lower semiconductor memory element 9.

The electrode pads 12E to 12H of the fifth through eighth semiconductor memory elements 9E to 9H are positioned in a state exposed upward near the second pad region 8B of the wiring board 2. The electrode pads 12E to 12H of the fifth through eighth semiconductor memory elements 9E to 9H are electrically connected to the connection pads 7, which are arranged on the second pad region 8B, through second metallic wires 15. A general Au wire or Cu wire is used for the metallic wires 13, 15. It is also used for a metallic wire 17 described later.

When the fifth through eighth electrode pads 12E to 12H have the same electric properties and signal characteristics, they can be connected sequentially by the second metallic wires 15. In other words, the eighth electrode pads 12H and the seventh electrode pads 12G are connected by the metallic wires 15. Similarly, the metallic wires 15 are used to connect between the seventh electrode pads 12G and the sixth electrode pads 12F and between the sixth electrode pads 12F and the fifth electrode pads 12E. Lastly, the fifth electrode pads 12E and the connection pads 7 are connected by the metallic wires 15. Wire bonding of the individual pads may be conducted independently, or they may be connected sequentially by a single metallic wire.

The controller element 10 is adhered onto the second element group 14 via an adhesive layer (not shown). The controller element 10 has an L-shaped pad structure, which is provided with electrode pads 16 which are arranged along one short side and also one long side which is orthogonal to the short side. Electrode pads 16A of the controller element 10 are electrically connected to the connection pads 7 arranged on the first pad region 8A through the third metallic wires 17, and electrode pads 16B are electrically connected to the connection pads 7 arranged on the third pad region 8C through the third metallic wires 17.

A sealing resin layer 18 formed of, for example, an epoxy resin is mold formed on the first surface 2a of the wiring board 2 on which the semiconductor memory elements 9 and the controller element 10 are mounted. The semiconductor memory elements 9 and the controller element 10 are integrally sealed together with the metallic wires 13, 15, 17 and the like by the sealing resin layer 18. A slope portion 19 is formed at a leading end of the sealing resin layer 18 to indicate the front of the memory card. A tab 20 is formed at a rear part of the sealing resin layer 18 by partially protruding the sealing resin. Thus, the semiconductor memory device 1 which is used as a semiconductor memory card is configured. The sealing resin layer 18 is not shown in FIG. 1.

The semiconductor memory device 1 configures solely a semiconductor memory card (e.g., micro SD™ card) without using a housing case such as a base card. Therefore, the sealing resin layer 18 or the like is in a state directly exposed outside. A cutout portion and a recess portion indicating the forward and backward direction and the front and rear surface direction of the memory card and the slope portion 19 are formed on the semiconductor memory device 1 itself.

The stepped directions of the first element group 11 and the second element group 14 are reversed in the semiconductor memory device 1 of the first embodiment to suppress the occupied areas of the semiconductor memory elements 9A to 9H relative to the wiring board 2 from increasing with the individual electrode pads 12A to 12H exposed. In other words, when all the eight semiconductor memory elements are stacked in the step-like shape, their occupied area becomes an area resulting from the addition of the areas of displaced portions of seven semiconductor memory elements to the area of a single semiconductor memory element.

Meanwhile, the element occupied area of the semiconductor memory device 1 becomes an area resulting from the addition of an area of a displaced portion of the fifth semiconductor memory element 9E to expose the fourth electrode pads 12D to the occupied area (area resulting from the addition of the areas of the displaced portions of three semiconductor memory elements to the area of one semiconductor memory element 9) of the first element group 11. Thus, the occupied area of the semiconductor memory elements 9 with respect to the wiring board 2 can be suppressed from increasing by stacking with the stepped directions of the first element group 11 and the second element group 14 inverted. Therefore, the pad arrangement regions 8A, 8B can be secured along the individual short sides 3A, 3B of the wiring board 2. Thus, it becomes possible to maintain the connection between the controller element 10 having the L-shaped pad structure and the wiring board 2.

But, since the fifth semiconductor memory element 9E is arranged in a state displaced with respect to the first element group 11, an end having the electrode pads 12E is protruded from the fourth semiconductor memory element 9D. Therefore, the electrode pads 12E of the fifth semiconductor memory element 9E have a hollow state below them. In other words, the fifth semiconductor memory element 9E has an overhang structure and a possibility of being deflected at the time of wire bonding to the electrode pads 12E. The deflection of the semiconductor memory elements 9 becomes a cause of a defective connection, an element crack or the like as described above.

Accordingly, among the semiconductor memory elements 9E to 9H configuring the second element group 14 in the semiconductor memory device 1 of the first embodiment, thickness T1 of the lowermost fifth semiconductor memory element 9E is increased to be larger than thickness T2 of each of the other semiconductor memory elements 9F to 9H. Thus, only the thickness T1 of the fifth semiconductor memory element 9E having an overhang structure is increased and the thickness T2 of each of the sixth through eighth semiconductor memory elements 9F to 9H having the other semiconductor memory element 9 below the electrode pads 12 is decreased to be smaller than the T1 (T1>T2) to prevent a defective connection, an element crack or the like from generating at the time of wire bonding to the fifth electrode pads 12E, and an increase in the laminate thickness of the semiconductor memory elements 9 can be suppressed.

It is preferable that the thickness T1 of the fifth semiconductor memory element 9E is in a range of 50 to 150 μm. If the thickness T1 is less than 50 μm, a defective connection, an element crack or the like cannot be suppressed at the time of wire bonding to the fifth electrode pads 12E. If the thickness T1 exceeds 150 μm, the laminate thickness of the semiconductor memory elements 9 becomes excessively large. It is preferable that the thickness T2 of each of the sixth through eighth semiconductor memory elements 9F to 9H satisfies T1>T2 and in a range of 10 to 50 μm. If the thickness T2 exceeds 50 μm, the laminate thickness of the semiconductor memory elements 9 increases. It is hard to have the thickness T2 of less than 10 μm from a viewpoint of an element production process, and a crack tends to be caused easily at the time of production or handling.

It is preferable that thickness of each of the semiconductor memory elements 9A to 9D configuring the first element group 11 is decreased to be small in the same manner as the thickness T2 of each of the sixth through eighth semiconductor memory elements 9F to 9H. But, since the lowermost first semiconductor memory element 9A of the first element group 11 is arranged on an uneven portion (uneven portion due to a level difference because of the presence or not of the wiring layer, a level difference because of a through hole portion, a level difference because of the terminals or test pads, etc.) which is on a surface of the wiring board 2, a large pressure is locally added at the time of mold-forming of the sealing resin layer 18. Therefore, if the first semiconductor memory element 9A is made excessively thin, there is a possibility of cracking because of a localized pressure applied at the time of mold forming Therefore, it is preferable that thickness T3 of the lowermost first semiconductor memory element 9A among the semiconductor memory elements 9A to 9D configuring the first element group 11 is larger than thickness T4 of each of the other semiconductor memory elements 9B to 9D (T3>T4). It is preferable that the thickness T3 of the first semiconductor memory element 9A is in a range of 50 to 150 μm. If the thickness T3 is less than 50 μm, the first semiconductor memory element 9A tends to be cracked easily by a local pressure at the time of mold forming. It is preferable that the thickness T2 of each of the second through fourth semiconductor memory elements 9B to 9D is in a range of 10 to 50

μm similar to the thickness T2 of each of the sixth through eighth semiconductor memory elements 9F to 9H.

In a case where the semiconductor memory device 1 is used to configure a micro SD™ card, thickness (card thickness) TC of the semiconductor memory device 1 is set to a range of, for example, 700 to 740 μm. Laminate thickness (element thickness) TE of the semiconductor memory elements 9 and the controller element 10 is required to fall within the card thickness TC by addition of the thickness of the wiring board 2 and the thickness of the sealing resin layer 18 on the controller element 10 to it. By satisfying the thicknesses of the semiconductor memory elements 9A to 9H described above, the plural semiconductor memory elements 9 are stacked to provide high capacity, and it is possible to achieve both the reduction of the element thickness TE and the suppression of defective bonding or the like. In other words, it becomes possible to enhance the production yield and reliability of the thin and high capacity semiconductor memory device 1.

For example, it is determined that the wiring board 2 has a thickness of 125 μm, the first semiconductor memory element 9A has a thickness of 60 μm, its adhesive layer has a thickness of 20 μm, the second through fourth semiconductor elements 9B to 9D each have a thickness of 30 μm, their adhesive layers each have a thickness of 5 μm, the fifth semiconductor memory element 9E has a thickness of 100 μm, its adhesive layer has a thickness of 5 μm, the sixth through eighth semiconductor elements 9E to 9H each have a thickness of 30 μm, their adhesive layers each have a thickness of 5 μm, the controller element 10 has a thickness of 30 μm, its adhesive layer has a thickness of 5 μm, and the sealing resin layer 18 has an on-element resin thickness of 145 μm. Then, a total thickness becomes 700 μm, which makes it possible to satisfy the card thickness TC.

It is preferable that a very thin semiconductor memory element 9 having a thickness of 20 to 40 μm is produced by applying, for example, a production method described below. Specifically, a semiconductor wafer having an element area on its surface is prepared. Grooves having a prescribed depth from the surface of the semiconductor wafer are formed by a blade or the like. It is determined that the grooves have a depth which is larger than the thickness of the completed element. Then, a protection tape is pasted to the front surface of the semiconductor wafer in which the grooves are formed, and the back surface of the semiconductor wafer is ground and polished to provide a desired element thickness. By the grinding and polishing processes to reach the grooves, the semiconductor elements are singulated while the semiconductor wafer is being held by the protection tape.

Then, a protection tape integrated with an adhesive agent film (a die attach film or the like) is pasted to the back surface of the semiconductor wafer, and only the protection tape is removed. Then, laser light is emitted along the shapes of the semiconductor elements divided by the grooves to cut the adhesive agent film pasted to the back surface of the semiconductor wafer according to the shapes of the semiconductor elements. Thus, the semiconductor elements having the singulated adhesive agent film can be obtained. A combination of dicing before grinding of the semiconductor wafer and cutting of the adhesive agent film with laser light enables to obtain a very thin semiconductor element, to which the adhesive agent film is pasted, with a good reproducibility.

In the semiconductor memory device 1 of the first embodiment, the mounted number (stacked number) of the semiconductor memory elements 9 is not limited to eight, but it is adequate if the number of the semiconductor memory elements 9 configuring the first element group 11 and the second element group 14 is plural. But, in order to provide the semiconductor memory device 1 with high capacity, the number of the semiconductor memory elements 9 configuring the first element group 11 and the second element group 14 is preferably four or more (a total of eight or more). For example, when eight semiconductor memory elements 9 each having a storage capacity of 1 GB are used, an 8-GB micro SD™ card can be realized by the semiconductor memory device 1.

Figure 3:
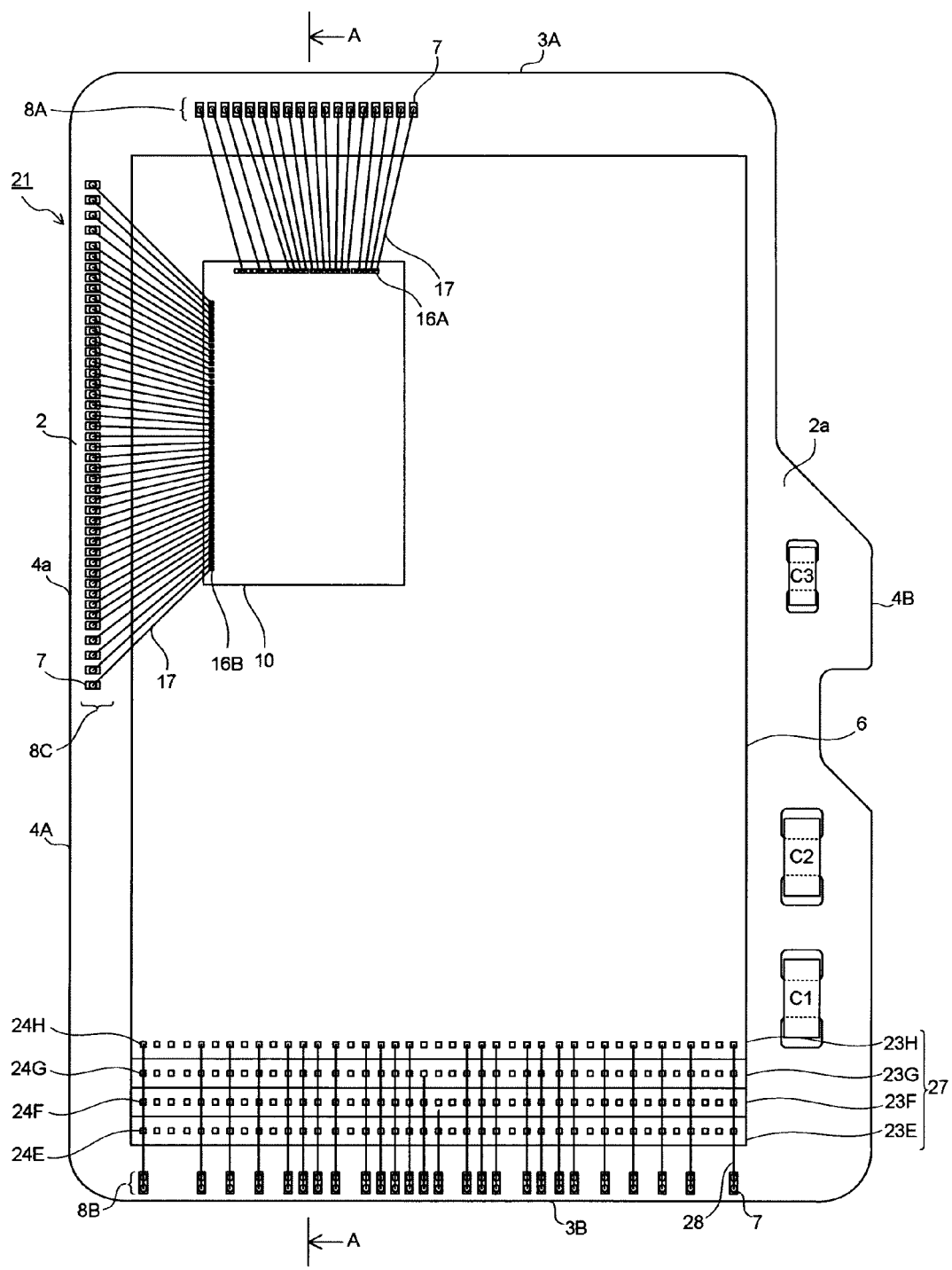
FIG. 3 is a plan view showing a semiconductor memory device according to a second embodiment of the present invention.
Figure 4:
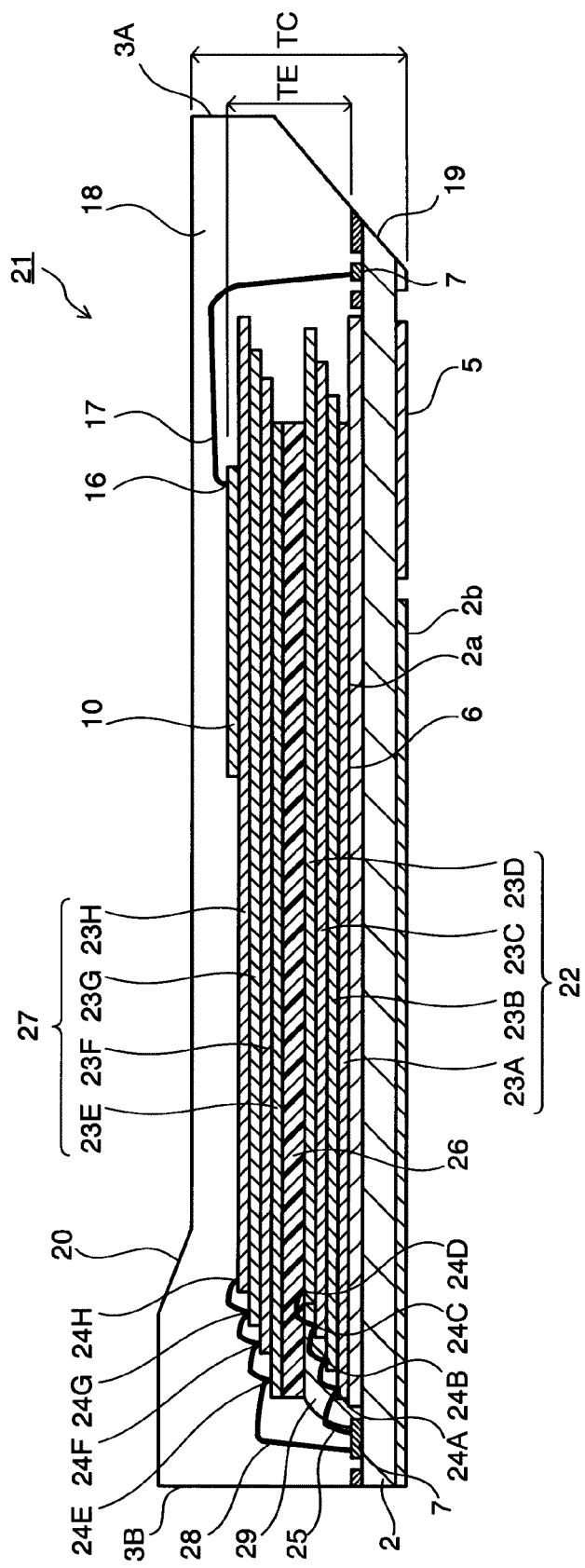
FIG. 4 is a sectional view taken along line A-A of FIG. 3.

A second embodiment of the present invention is described below. FIG. 3 and FIG. 4 show a structure of a semiconductor memory device (semiconductor device) according to the second embodiment. FIG. 3 is a plan view showing the structure of the semiconductor memory device (semiconductor device) according to the second embodiment, and FIG. 4 is a sectional view (sectional view cut in a direction of the long side) taken along line A-A of FIG. 3. Like component parts corresponding to those of the first embodiment are denoted by like reference numerals, and description of them is omitted in part. The semiconductor memory device 21 shown in FIG. 3 and FIG. 4 configures a semiconductor memory card in the same manner as in the first embodiment.

The semiconductor memory device 21 is provided with a wiring board 2 which serves as an element-mounting substrate and a terminal-forming substrate. A first surface 2a of the wiring board 2 has an element mounting section 6 and a first wiring network including connection pads 7. An external connection terminal 5 which becomes an input/output terminal of a memory card is formed on a second surface 2b of the wiring board 2. The structure and the outer shape of the wiring board 2, the arrangement regions (pad regions 8A to 8C) of the connection pads 7 and the like are same as in the first embodiment.

A first semiconductor memory element 23A, a second semiconductor memory element 23B, a third semiconductor memory element 23C and a fourth semiconductor memory element 23D which configure a first element group (memory element group) 22 are sequentially stacked on the element mounting section 6 of the wiring board 2. The first through fourth semiconductor memory elements 23A to 23D have the same rectangular shape and electrode pads 24A to 24D respectively. The first through fourth electrode pads 24A to 24D are arranged along one outline sides, specifically one short sides, of the semiconductor memory elements 23A to 23D. The first through fourth semiconductor memory elements 23A to 23D have a single short-side pad structure.

The first semiconductor memory element 23A has its electrode formation surface, on which the first electrode pads 24A are formed, directed upward and is adhered onto the element mounting section 6 of the wiring board 2 via an adhesive layer (not shown). For the adhesive layer, a die attach film (adhesive agent film) which is mainly composed of a general polyimide resin, epoxy resin, acrylic resin or the like is used. The adhesive layer of the other semiconductor memory elements is also formed of the same material. The first semiconductor memory element 23A is arranged with a pad arrangement side (one short side) directed toward a short side 3B of the wiring board 2 such that the first electrode pads 24A are positioned near the second pad region 8B of the wiring board 2.

The second semiconductor memory element 23B is adhered onto the first semiconductor memory element 23A via an adhesive layer (not shown) with an electrode formation surface, on which the second electrode pads 24B are formed, directed upward and the first electrode pads 24A exposed. Similarly, the third semiconductor memory element 23C is adhered onto the second semiconductor memory element 23B, and the fourth semiconductor memory element 23D is adhered onto the third semiconductor memory element 23C via an adhesive layer (not shown). The second through fourth semiconductor memory elements 23B to 23D are sequentially stacked in a step-like shape on the first semiconductor memory element 23A with the pad arrangement sides directed to the same direction as the first semiconductor memory element 23A and the electrode pads 24 of the lower side of the semiconductor memory elements 23 exposed.

The first through fourth semiconductor memory elements 23A to 23D are stacked in a step-like shape with their short sides displaced in the direction of the long side with the respective pad arrangement sides directed to the same direction and the long sides aligned so as to expose the electrode pads 24 of the lower semiconductor memory elements 23. The first through fourth electrode pads 24A to 24D are positioned near the second pad region 8B in a state exposed upward. The first through fourth electrode pads 24A to 24D are electrically connected to the connection pads 7 which are arranged on the second pad region 8B through first metallic wires 25. Similar to the first embodiment, when the first through fourth electrode pads 24A to 24D have the same electric properties and signal characteristics, they are connected sequentially through the first metallic wires 25.

A fifth semiconductor memory element 23E, a sixth semiconductor memory element 23F, a seventh semiconductor memory element 23G and an eighth semiconductor memory element 23H which configure a second element group (second memory element group) 27 are sequentially stacked on the first element group 22 via an adhesive layer (not shown) with a spacer layer 26 interposed so as to expose the fourth electrode pads 24D. The fifth through eighth semiconductor memory elements 23E to 23H have the same rectangular shape and electrode pads 24E to 24H respectively. The fifth through eighth electrode pads 24E to 24H are arranged along one outline sides, specifically one short sides, of the semiconductor memory elements 23E to 23H. The fifth through eighth semiconductor memory elements 23E to 23H have a single short-side pad structure.

The fifth through eighth semiconductor memory elements 23E to 23H are stacked in a step-like shape with the arrangement position and the stacked structure aligned with the first through fourth semiconductor memory elements 23A to 23D. In other words, the fifth semiconductor memory element 23E is arranged with the short side and the long side aligned with those of the first semiconductor memory element 23A, and the other semiconductor memory elements 23F to 23H are also arranged in the same manner. The fifth through eighth semiconductor memory elements 23E to 23H are stacked in a step-like shape with their pad arrangement sides directed to the second pad region 8B and directed to the same direction as the stepped direction of the first element group 22 so as to expose the electrode pads 24 of the lower semiconductor memory elements 23.

The electrode pads 24E to 24H of the fifth through eighth semiconductor memory elements 23E to 23H are positioned in a state exposed upward near the second pad region 8B of the wiring board 2. The electrode pads 24E to 24H of the fifth through eighth semiconductor memory elements 23E to 23H are electrically connected to the connection pads 7 arranged on the second pad region 8B through second metallic wires 28. When the fifth through eighth electrode pads 24E to 24H have the same electric properties and signal characteristics, they can be connected sequentially by the second metallic wires 28.

The spacer layer 26 is formed of an insulating resin layer which can incorporate the element-side ends of the metallic wires 25 connected to the fourth electrode pads 24D. The ends of the metallic wires 25 connected to the fourth semiconductor memory element 23D which is positioned on the top of the first element group 22 are buried into the insulating resin layer 26. The insulating resin layer 26 has a function as the adhesive layer of the fifth semiconductor memory element 23E in addition to the function as the spacer layer.

The insulating resin layer (spacer layer) 26 is formed on the back surface of the fifth semiconductor memory element 23E and adhered to the fourth semiconductor memory element 23D to incorporate the element-side ends of the metallic wires 25 which are connected to the fourth electrode pads 24D. It is preferable that the insulating resin layer 26 is formed of, for example, a thermoplastic resin such as acrylic resin or a thermosetting resin such as epoxy resin, and its thickness is in a range of 40 to 100 μm. A spacer layer 26 in a general element form may be used instead of the insulating resin layer 26.

A controller element 10 having an L-shaped pad structure is adhered onto the second element group 27 via an adhesive layer (not shown) in the same manner as in the first embodiment. Electrode pads 16A, 16B of the controller element 10 are electrically connected to the connection pads 7 which are arranged on the first pad region 8A and the third pad region 8C of the wiring board 2 through third metallic wires 17 in the same manner as in the first embodiment.

A sealing resin layer 18 for sealing the semiconductor memory element 23 and the controller element 10 together with the metallic wires 25, 28, 17 and the like is formed on the first surface 2a of the wiring board 2. A slope portion 19 is formed at a leading end of the sealing resin layer 18 and a tab 20 is formed at its rear part. Thus, the semiconductor memory device 21 which is used as a semiconductor memory card is configured of them. The sealing resin layer 18 is not shown in FIG. 3.

The semiconductor memory device 21 configures solely a semiconductor memory card (e.g., micro SD™ card) without using a housing case such as a base card. Therefore, the sealing resin layer 18 is in a state directly exposed outside. A cutout portion and a recess portion which indicate the forward and backward direction and the front and rear surface direction of the memory card and the slope portion 19 are formed on the semiconductor memory device 21 itself.

In the semiconductor memory device 21 of the second embodiment, the spacer layer 26 is interposed between the first element group 22 and the second element group 27, and the first element group 22 and the second element group 27 are determined to have the same stepped direction and arrangement structure to suppress an increase in the occupied area of the semiconductor memory elements 23A to 23H relative to the wiring board 2 with the electrode pads 24A to 24H exposed. In other words, since the projected areas of a first element group 11 and a second element group 14 relative to the wiring board 2 are aligned, the element occupied area of the semiconductor memory device 21 becomes an occupied area (area resulting from the addition of the areas of displaced portions of three semiconductor memory elements to the area of one semiconductor memory element 23) of one element group.

An increase in the occupied area of the semiconductor memory element 23 with respect to the wiring board 2 can be suppressed by determining to have the same stepped direction and arrangement structure between the first element group 22 and the second element group 27. Therefore, the pad arrangement regions 8A, 8B can be secured along the individual short sides 3A, 3B of the wiring board 2. Thus, it becomes possible to maintain the connection between the controller element 10 having the L-shaped pad structure and the wiring board 2. But, since the fifth semiconductor memory element 23E is arranged to protrude from the first element group 11, the electrode pads 24E have a hollow state below them. Namely, the fifth semiconductor memory element 23E has an overhang structure.

Accordingly, the semiconductor memory device 21 of the second embodiment has an insulating resin 29 charged into the hollow portion below the electrode pads 24E of the fifth semiconductor memory element 23E having the overhang structure. For the insulating resin 29, a thermosetting resin such as an epoxy resin, a polyimide resin, a silicone resin or the like is used. The insulating resin 29 is formed by arranging the first element group 22 and the second element group 27 on the wiring board 2, and charging to cure a liquid resin in the hollow portion which is below the fifth semiconductor memory element 23E. The liquid resin is injected in the hollow portion by a dispenser or the like.

By charging the insulating resin 29 into the hollow portion which is below the electrode pads 24E of the fifth semiconductor memory element 23E, a defective connection or an element crack can be prevented from occurring at the time of wire bonding to the fifth electrode pads 24E. The wire bonding properties to the fifth semiconductor memory element 23E having the overhang structure is secured by the insulating resin 29, so that the fifth through eighth semiconductor memory elements 23E to 23H configuring the second element group 27 can be made thin. It is preferable that the fifth through eighth semiconductor memory elements 23E to 23H have a thickness in a range of 10 to 50 µm. It is preferable that the first element group 22 is configured in the same manner as in the first embodiment.

In a case where the semiconductor memory device 21 is used to configure a micro SD™ card, thickness (card thickness) TC of the semiconductor memory device 21 is set to a range of 700 to 740 µm as described above. Laminate thickness (element thickness) TE of the semiconductor memory element 23 and the controller element 10 is required to fall in a range of the card thickness TC by addition of the thickness of the wiring board 2 and the on-element resin thickness to it. By applying the above-described structure of filling the insulating resin 29 into the hollow portion and the thicknesses of the semiconductor memory elements 23A to 23H, the plural semiconductor memory elements 23 are stacked to provide high capacity, and it is possible to achieve both the reduction of the element thickness TE and the suppression of defective bonding. In other words, it becomes possible to enhance the production yield and reliability of the thin and high capacity semiconductor memory device 21.

For example, when it is determined that the wiring board 2 has a thickness of 125 µm, a first semiconductor memory element 9A has a thickness of 60 µm, its adhesive layer has a thickness of 20 µm, second through eighth semiconductor elements 9B to 9H each have a thickness of 30 µm, the individual adhesive layers have a thickness of 5 µm excepting the thickness of the adhesive layer which becomes the spacer layer 26, the spacer layer 26 has a thickness of 60 µm, the controller element 10 has a thickness of 30 µm, its adhesive layer has a thickness 5 µm, and the sealing resin layer 18 has an on-element resin thickness of 160 µm. Then, a total thickness becomes 700 µm, which makes it possible to satisfy the card thickness TC. A very thin semiconductor memory element 23 having a thickness of 20 to 40 µm can be obtained in the same manner as in the first embodiment.

In the semiconductor memory device 21 of the second embodiment, the mounted number (stacked number) of the semiconductor memory elements 23 is not limited to eight, but it is adequate if the number of the semiconductor memory elements 23 configuring the first element group 22 and the second element group 27 is plural. But, in order to provide the semiconductor memory device 21 with high capacity, the number of the semiconductor memory elements 23 configuring the first element group 22 and the second element group 27 is preferably four or more (a total of eight or more). For example, when eight semiconductor memory elements 23 having a storage capacity of 1 GB are used, an 8-GB micro SD™ card can be realized by the semiconductor memory device 21.

The application of the insulating resin 29 into the semiconductor memory device 21 is not limited to the structure that the first element group 22 and the second element group 27 are arranged on the wiring board 2 with the stepped direction and the arrangement structure aligned. For example, even when the first element group 22 and the second element group 27 are stacked in a step-like shape with their directions reversed as in the first embodiment, there is a semiconductor memory element having an overhang structure as described above. The insulating resin (insulating resin charged into the hollow portion below the electrode pads of the semiconductor element having an overhang structure) 29 can also be applied to the above semiconductor element, and the same effect can be obtained. The insulating resin 29 can be applied to semiconductor elements having various types of overhang structures.

Figure 5:
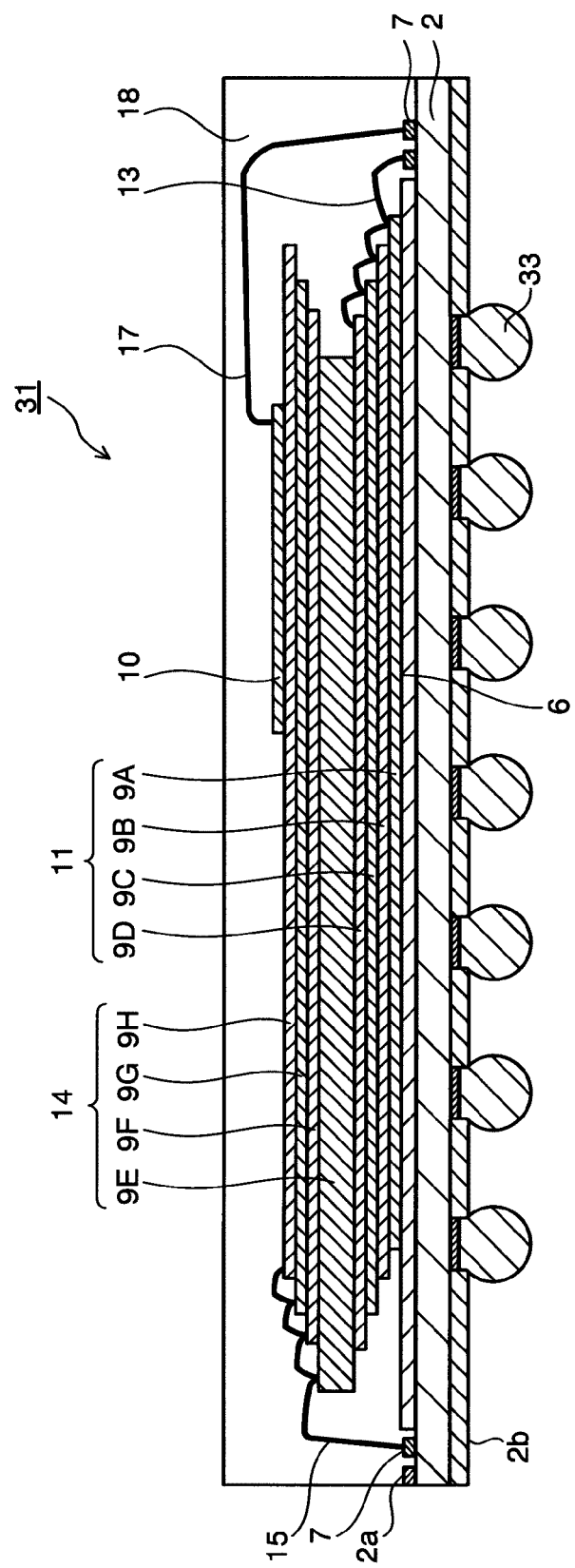
FIG. 5 is a sectional view showing a modified example of the semiconductor memory device according to the first embodiment.
Figure 6:
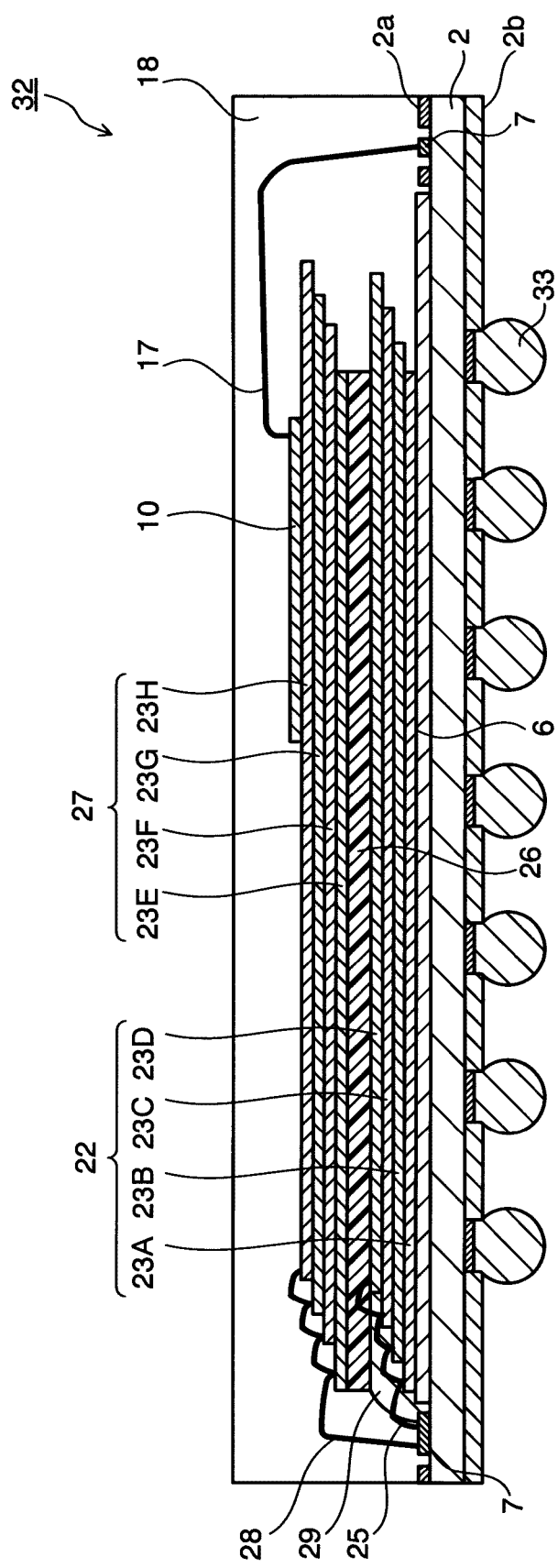
FIG. 6 is a sectional view showing a modified example of the semiconductor memory device according to the second embodiment.

The semiconductor memory devices 1, 21 of the first and second embodiments are effective for a semiconductor memory card which is configured of it solely, but a semiconductor memory card using a casing such as a base card is not necessarily excluded. Besides, they can also be applied to semiconductor memory devices other than the semiconductor memory card. FIG. 5 and FIG. 6 show structures that the first and second embodiments are applied to BGA type semiconductor packages 31, 32. The semiconductor packages 31, 32 have the same basic structure as the semiconductor memory devices 1, 21, excepting that external connection terminals (ball terminals) 33 formed of solder balls or the like are provided on the second surface 2b of the wiring board 2. The semiconductor package may have an LGA structure.

Figure 7:
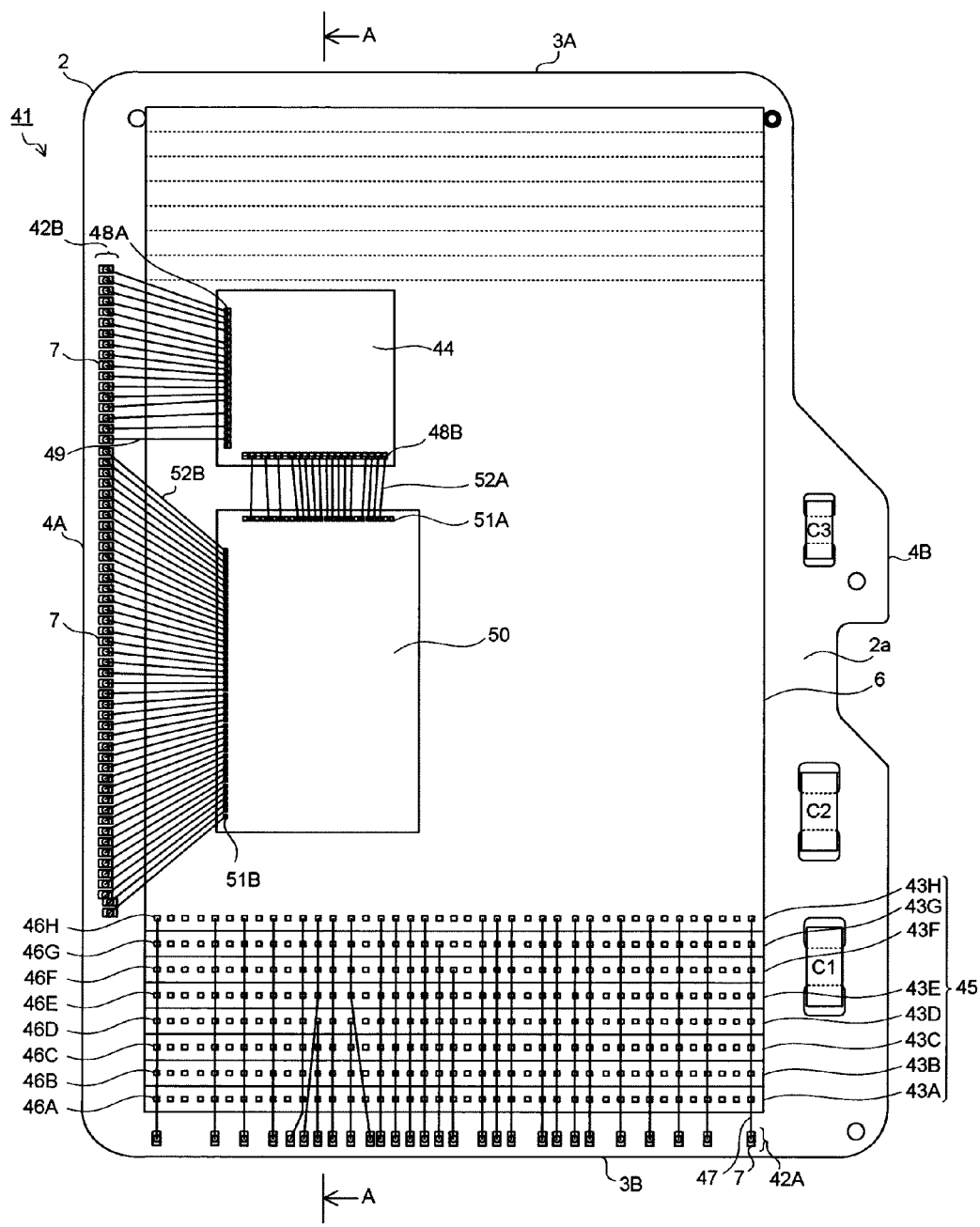
FIG. 7 is a plan view showing a semiconductor memory device according to a third embodiment of the present invention.
Figure 8:
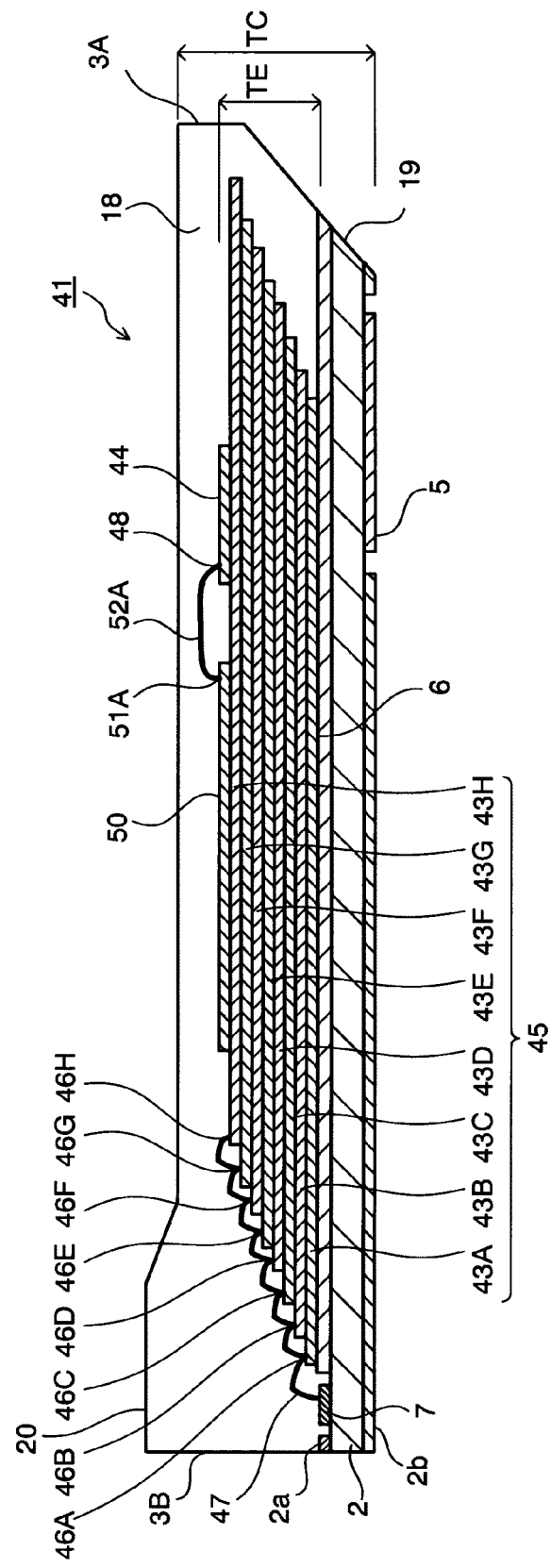
FIG. 8 is a sectional view taken along line A-A of FIG. 7.

A third embodiment of the present invention is described below. FIG. 7 and FIG. 8 show structures of the semiconductor memory device according to the third embodiment. FIG. 7 is a plan view showing a structure of the semiconductor memory device according to the third embodiment, and FIG. 8 is a sectional view taken along line A-A of FIG. 7. Like component parts corresponding to those of the first embodiment are denoted by like reference numerals. The semiconductor memory device 41 shown in FIG. 7 and FIG. 8 configures a semiconductor memory card in the same manner as in the first embodiment.

The semiconductor memory device 41 has a wiring board 2 which serves as an element-mounting substrate and a terminal-forming substrate. For example, the wiring board 2 has wiring networks provided within and on the front surface of an insulating resin substrate, and specifically a printed circuit board using a glass-epoxy resin, a BT resin (bismaleimide triazine resin) or the like is applied. The wiring board 2 has a first surface 2a which becomes an element-mounted surface and a second surface 2b which becomes a terminal formation surface.

The wiring board 2 has a substantially rectangular profile. One short side 3A of the wiring board 2 corresponds to a leading end of a memory card inserted into a card slot. The other short side 3B corresponds to the rear end part of the memory card. One long side 4A of the wiring board 2 has a linear shape, and the other long side 4B has a cutout portion and a recess portion to indicate the forward and backward direction and the front and rear surface direction of the memory card. Each corner of the wiring board 2 has a curved shape (R shape).

An external connection terminal 5 which becomes an input/output terminal of the memory card is formed on the second surface 2b of the wiring board 2. The external connection terminal 5 is formed of a metal layer which is formed by electrolytic plating or the like. The second surface 2b of the wiring board 2 corresponds to the front surface of the memory card. Besides, a second wiring network (not shown) is provided in a region on the second surface 2b of the wiring board 2 excepting a region where the external connection terminal 5 is formed. The second wiring network has test pads of the memory card. The second wiring network provided on the second surface 2b is covered with an insulating layer (not shown) using an insulating adhesive seal or adhesive tape.

The first surface 2a of the wiring board 2 has an element mounting section 6 and a first wiring network including connection pads 7 which become bonding portions at the time of wire bonding. The first surface 2a of the wiring board 2 corresponds to the back surface of the memory card. The first wiring network having the connection pads 7 is electrically connected to the external connection terminal 5 and the second wiring network through unshown internal wirings (through holes etc.) of the wiring board 2. The connection pads 7 are arranged on a first pad region 42A along the short side 3B, and a second pad region 42B along the long side 4A.

Plural semiconductor memory elements 43 are mounted by stacking on the first surface 2a of the wiring board 2. For example, a NAND-type flash memory is used as the semiconductor memory elements 43. A controller element 44 is stacked on the semiconductor memory elements 43. The controller element 44 selects a semiconductor memory element to write and read data to and from the plural semiconductor memory elements 43, writes data into the selected semiconductor memory element 43 or reads data which is stored in the selected semiconductor memory element 43.

A first semiconductor memory element 43A, a second semiconductor memory element 43B, a third semiconductor memory element 43C, a fourth semiconductor memory element 43D, a fifth semiconductor memory element 43E, a sixth semiconductor memory element 43F, a seventh semiconductor memory element 43G and an eighth semiconductor memory element 43H which configure a memory element group 45 are sequentially stacked in a step-like shape on the element mounting section 6 of the wiring board 2 via an adhesive layer (not shown). For the adhesive layer, a die attach film which is mainly composed of a general polyimide resin, epoxy resin, acrylic resin or the like is used.

The first through eighth semiconductor memory elements 43A to 43H have the same rectangular shape and are provided with electrode pads 46A to 46H. The first through eighth electrode pads 46A to 46H are arranged along one outline sides, specifically one short sides, of the semiconductor memory elements 43A to 43H. The first through eighth semiconductor memory elements 43A to 43H have a single short-side pad structure. The first semiconductor memory element 43A is arranged with the pad arrangement side (one short side) directed to the short side 3B of the wiring board 2 so that the first electrode pad 46A is positioned near the first pad region 42A.

Similarly, the second through eighth semiconductor memory elements 43B to 43H are arranged with the pad arrangement sides directed to the same direction as the first semiconductor memory element 43A. And, the second through eighth semiconductor memory elements 43B to 43H are sequentially stacked in a step-like shape on the first semiconductor memory element 43A so that the individual electrode pads 46A to 46H are exposed upward. Specifically, the first through eighth semiconductor memory elements 43A to 43H are stacked in a step-like shape with their pad arrangement sides directed to the same direction, the long sides aligned, and the short sides displaced in the direction of the long sides so as to expose electrode pads 46 of the lower semiconductor memory elements 43.

The electrode pads 46A to 46H of the first through eighth semiconductor memory elements 43A to 43H are electrically connected to the connection pads 7 which are arranged on the first pad region 42A through first metallic wires 47. When the first through eighth electrode pads 46A to 46H have the same electric properties and signal characteristics, they can be connected sequentially by the first metallic wires 47. A general Au wire or Cu wire is used for the metallic wires 47. It is also used for metallic wires 49, 52 described later.

The controller element 44 is adhered onto the memory element group 45 via an adhesive layer (not shown). The controller element 44 has an L-shaped pad structure in the same manner as in the above-described first and second embodiments and is provided with electrode pads 48A, 48B which are arranged along a first outline side and a second outline side which is orthogonal to it. Between the electrode pads 48A, 48B, the electrode pads 48A (electrode pads 48A which are arranged along the first outline side parallel to the long side 4A of the wiring board 2) which are positioned near the second pad region 42B are electrically connected to the connection pads 7 arranged on the second pad region 42B through the second metallic wires 49.

Since the first through eighth semiconductor memory elements 43A to 43H are sequentially stacked in the step-like shape, a length in the stepped direction of the stacked structure of the semiconductor memory elements 43 becomes long. The area (projected area of all elements) occupied by the semiconductor memory elements 43 relative to the wiring board 2 increases, and the pad arrangement region along the short side of the wiring board 2 is restricted. Since the size of the semiconductor memory card is defined, a pad region cannot be set on a region along the short side 3A of the wiring board 2 in this embodiment. Since the controller element 44 has the L-shaped pad structure, all the electrode pads 48 cannot be wire bonded directly to the connection pads 7 by only the second pad region 42B which is provided along the long side 4A of the wiring board 2.

Accordingly, in the semiconductor memory device 41 according to the third embodiment, a relay element 50 is arranged in parallel to the controller element 44 on the memory element group 45. The relay element 50 is adhered onto the eighth semiconductor memory element 43H via an adhesive layer (not shown) in the same manner as the other elements. The relay element 50 has electrode pads (relay pads) 51A, 51B which are arranged along one outline side and the other outline side which is orthogonal to it. The relay element 50 is arranged such that the electrode pads 51A are opposite to the electrode pads 48B of the controller element 44, and the electrode pads 51B are positioned near the second pad region 42B. The relay element 50 is produced in the same manner as an ordinary semiconductor element.

The electrode pads 48B (electrode pads arranged along the second outline side which is orthogonal to the long side 4A of the wiring board 2) of the controller element 44 are electrically connected to the electrode pads 51A of the relay element 50 through third metallic wires (first relay metallic wires) 52A. Besides, the electrode pads 51B of the relay element 50 are electrically connected to the connection pads 7 arranged on the second pad region 42B through third metallic wires (second relay metallic wires) 52B. The relay element 50 has a wiring layer for connecting the electrode pads 51A and the electrode pads 51B. The electrode pads 48B of the controller element 44 and the connection pads 7 arranged on the second pad region 42B are electrically connected to each other by the third metallic wires 52 via the relay element 50.

A sealing resin layer 18 formed of, for example, an epoxy resin is mold formed on the first surface 2a of the wiring board 2 on which the semiconductor memory elements 43 and the controller element 44 are mounted. The semiconductor memory elements 43, the controller element 44 and the relay element 50 are integrally sealed together with the metallic wires 47, 49, 52 and the like by the sealing resin layer 18. A slope portion 19 is formed at a leading end of the sealing resin layer 18 and a tab 20 is formed at a rear part of the sealing resin layer 18. Thus, the semiconductor memory device 41 which is used as a semiconductor memory card is configured. The sealing resin layer 18 is not shown in FIG. 7.

Since the first through eighth semiconductor memory elements 43A to 43H configuring the memory element group 45 are stacked in the step-like shape to expose the electrode pads 46A to 46H, one short sides which are opposed to the other short sides where the electrode pads 46 are arranged are sequentially protruded in an overhang-like shape. The overhang portions of the semiconductor memory elements 43 in the stacked body are inclined in the same direction as the slope portion 19 which is provided at the leading end of the sealing resin layer 18. The stacked body of the semiconductor memory elements 43 is arranged such that a part of the overhang portion overlaps the slope portion 19 of the sealing resin layer 18, thereby complying with an increase in the number of the memory elements to be included in the sealing resin layer 18.

The semiconductor memory device 41 configures solely a semiconductor memory card (e.g., micro SD™ card) without using a housing case such as a base card. Therefore, the sealing resin layer 18 and the like are in a state directly exposed outside. A cutout portion and a recess portion which indicate the forward and backward direction and the front and rear surface direction of the memory card and the slope portion 19 are formed on the semiconductor memory device 41 itself.

As described above, when the plural semiconductor memory elements 43 are stacked in the step-like shape, the semiconductor memory device 41 of the third embodiment has the electrode pads 48B, which are arranged along the second outline side of the controller element 44 having the L-shaped pad structure, connected to the connection pads 7 arranged on the second pad region 42B via the relay element 50. Thus, the connection of the controller element 44 is secured, and the number of the stacked semiconductor memory elements 43 can be increased. In other words, it becomes possible to provide a thin and high capacity semiconductor memory device 41.

It is preferable that the first through eighth semiconductor memory elements 43A to 43H configuring the memory element group 45 have a thickness in a range of 10 to 50 µm, excepting the lowermost first semiconductor memory element 43A. It is preferable that the first semiconductor memory element 43A which is in contact with the wiring board 2 has a thickness in a range of 50 to 150 µm similar to the first embodiment. In the third embodiment, eight semiconductor memory elements 43 are stacked without interposing a thick semiconductor element, spacer layer or the like for improving the wire bonding property. Therefore, even if the thickness of the semiconductor memory element 43 is increased to be slightly larger than in the first and second embodiments, the thickness of the semiconductor memory device 41 (e.g., a range of 700 to 740 µm) can be satisfied.

For example, it is determined that the wiring board 2 has a thickness of 125 µm, a first semiconductor memory element 43A has a thickness of 60 µm, its adhesive layer has a thickness of 20 µm, second through eighth semiconductor elements 43B to 43H each have a thickness of 40 µm, their adhesive layer has a thickness of 5 µm, a controller element 44 has a thickness of 40 µm, its adhesive layer has a thickness of 5 µm, and the sealing resin layer 18 has an on-element resin thickness of 135 µm. Then, a total thickness becomes 700 µm, which makes it possible to satisfy the card thickness TC (range of 700 to 740 µm) which is demanded for a micro SD™ card for example. The semiconductor memory element 43 having a thickness of 20 to 50 µm can be obtained in the same manner as in the first embodiment.

In the semiconductor memory device 41 of the third embodiment, the mounted number (stacked number) of the semiconductor memory elements 43 is not limited to eight, but it is adequate if the number of the semiconductor memory elements 43 configuring the memory element group 45 is plural. But, in order to provide the semiconductor memory device 41 with high capacity, the number of the semiconductor memory elements 43 configuring the memory element group 45 is preferably eight or more. For example, when eight semiconductor memory elements 43 each having a storage capacity of 1 GB are used, an 8-GB micro SD™ card can be realized by the semiconductor memory device 41.

The connection of the controller element 44 using the relay element 50 for the semiconductor memory device 41 is not limited to the case that plural semiconductor memory elements are stacked in the step-like shape. For example, it is also applicable to a case where the semiconductor memory elements are separately stacked into the plural element groups as described in the first and second embodiments. In a case where the semiconductor memory elements are separately stacked into plural element groups, the controller element and the relay element are mounted on the semiconductor memory element which is positioned on the top among the upper element groups and connected to the wiring board in the same manner as in the third embodiment.

Figure 9:
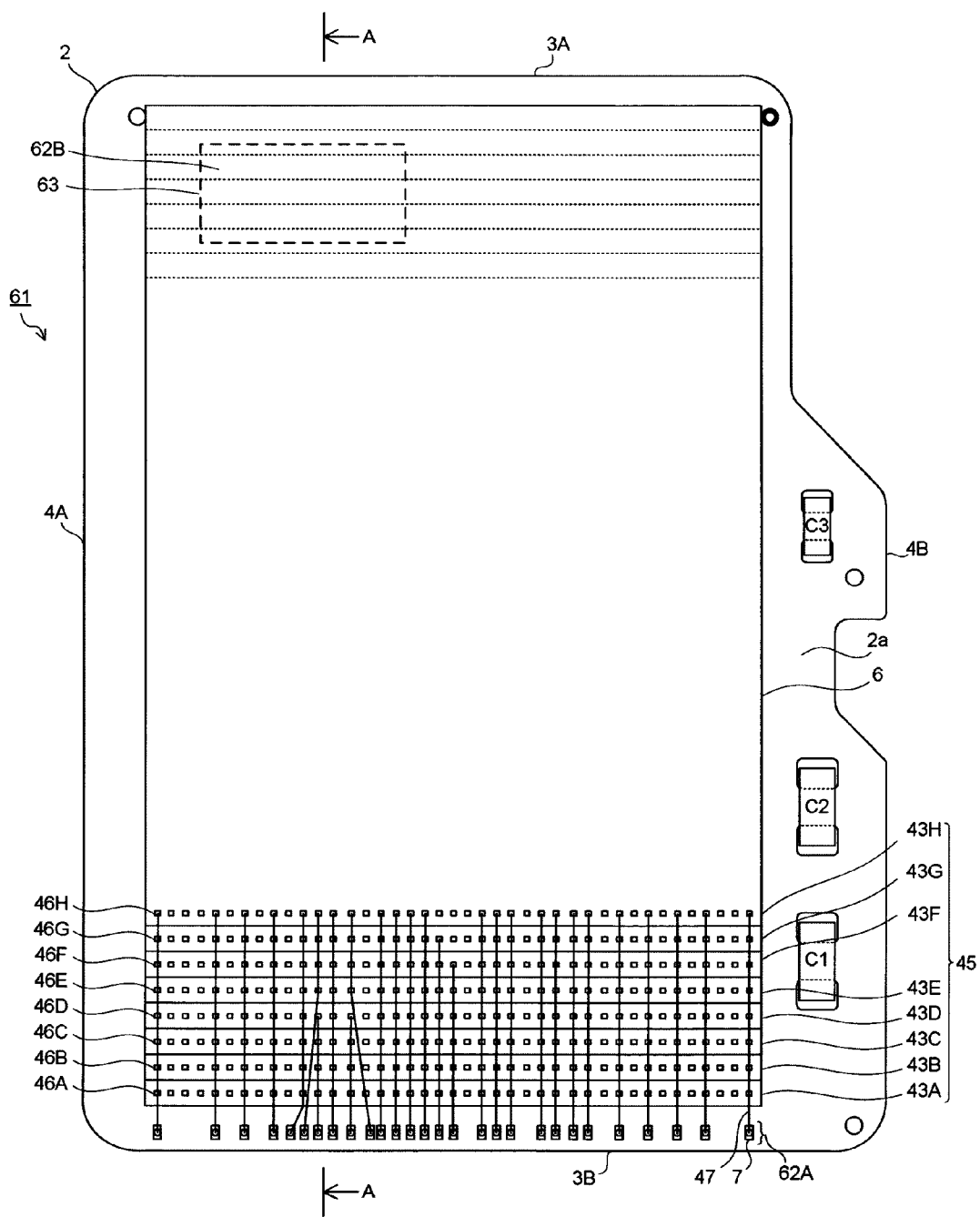
FIG. 9 is a plan view showing a semiconductor memory device according to a fourth embodiment of the present invention.
Figure 10:
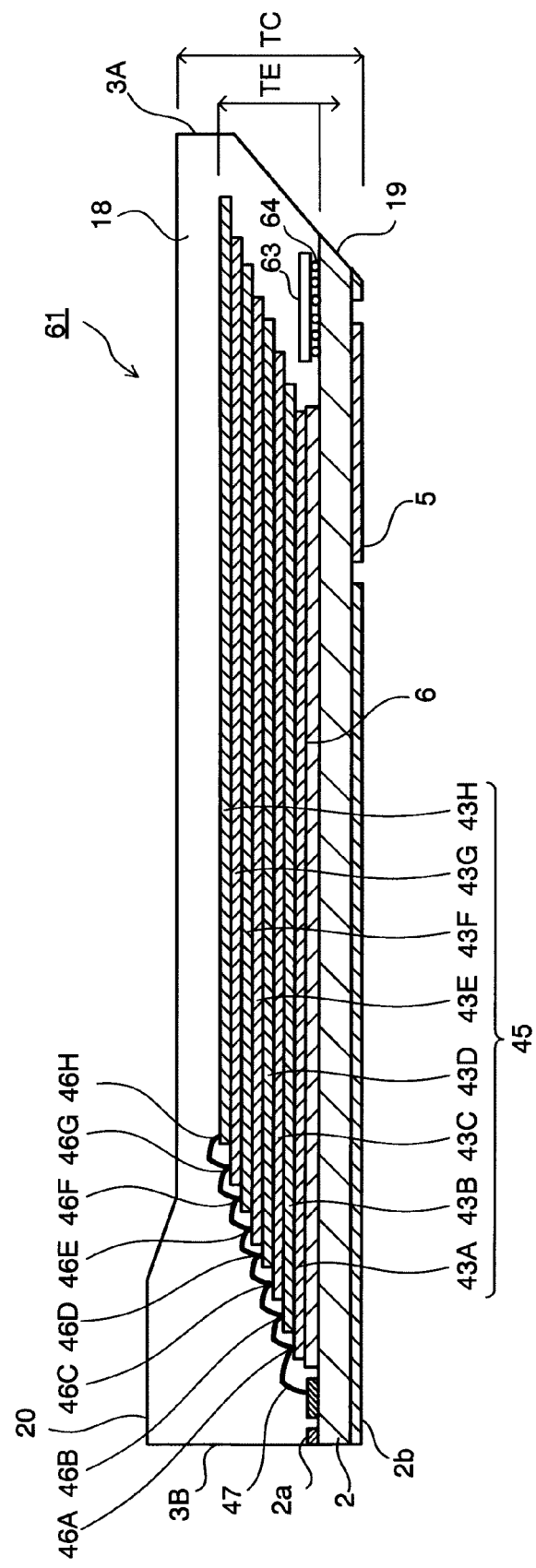
FIG. 10 is a sectional view taken along line A-A of FIG. 9.

Then, a fourth embodiment of the present invention is described. FIG. 9 and FIG. 10 show structures of a semiconductor memory device according to the fourth embodiment. FIG. 9 is a plan view showing a structure of a semiconductor memory device (semiconductor device) according to the fourth embodiment, and FIG. 10 is a sectional view (sectional view cut in a direction of the long side) taken along line A-A of FIG. 9. Like component parts corresponding to those of the third embodiment are denoted by like reference numerals, and description of them is omitted in part. A semiconductor memory device 61 shown in FIG. 9 and FIG. 10 configures a semiconductor memory card in the same manner as in the third embodiment.

First through eighth semiconductor memory elements (NAND-type flash memories) 43A to 43H are mounted by sequentially stacking in a step-like shape on an element mounting section 6 of a first surface 2a of a wiring board 2 via an adhesive layer (not shown). The first through eighth semiconductor memory elements 43A to 43H have the same rectangular shape and are provided with electrode pads 46A to 46H respectively. The first through eighth electrode pads 46A to 46H are arranged along one sides, specifically one short sides, of the outer shapes of the semiconductor memory elements 43A to 43H. The first through eighth semiconductor memory elements 43A to 43H have a single short-side pad structure.

Similar to the third embodiment, the first through eighth semiconductor memory elements 43A to 43H are stacked in a step-like shape with the pad arrangement sides directed to the same direction (direction of a short side 3B having a first pad region 62A), the long sides aligned, and the short sides displaced in the direction of the long sides so as to expose the electrode pads 46 of the lower semiconductor memory elements 43. The first through eighth electrode pads 46A to 46H are electrically connected to connection pads 7 arranged on the first pad region 62A through first metallic wires 47. When the first through eighth electrode pads 46A to 46H have the same electric properties and signal characteristics, they can be connected sequentially by the first metallic wires 47.

As described above, since the first through eighth semiconductor memory elements 43A to 43H are sequentially stacked in the step-like shape, a length of the semiconductor memory element 43 in the stepped direction in the stacked structure becomes long. Therefore, the occupied area of the semiconductor memory elements 43 relative to the wiring board 2 increases, and the pad arrangement region along the short side of the wiring board 2 is restricted. Since the size of the semiconductor memory card is defined, a pad region for wire bonding cannot be set on a region along a short side 3A of the wiring board 2. The controller element having an L-shaped pad structure cannot perform wire bonding of all the electrode pads to the connection pads.

Since the first through eighth semiconductor memory elements 43A to 43H configuring a memory element group 45 are stacked in the step-like shape to expose the electrode pads 46A to 46H, one short sides where the electrode pads 46 are arranged and the other short sides opposite to them are sequentially projected in an overhang shape. The semiconductor memory elements 43 in the stacked body are arranged such that the overhang portions partially overlap a slope portion 19 of a sealing resin layer 18. Besides, there is a space below the overhang portions of the semiconductor memory elements 43 in the stacked body, and a margin of the wiring board 2 is produced in the space portion.

Accordingly, in the semiconductor memory device 61 according to the fourth embodiment, a second pad region 62B having connection pads for flip-chip connection is provided at a part of the wiring board 2 corresponding to a part below the overhang portion of the memory element group 45, and a controller element 63 having a flip-chip connection structure is arranged on that region. The controller element 63 has bump electrodes 64 for flip-chip connection and is arranged below the overhang portion of the memory element group 45.

The bump electrodes 64 of the controller element 63 are flip-chip connected to the connection pads (not shown) arranged on the second pad region 62B. The bump electrodes 64 are formed of, for example, a low melting metal such as a solder alloy, an Au—Sn eutectic alloy or the like. Thus, the space below the overhang portion of the memory element group 45 having the step-like shape can be used to arrange the controller element 63 having the flip-chip connection structure on the wiring board 2 without increasing the area of the wiring board 2.

The sealing resin layer 18 formed of, for example, an epoxy resin is mold formed on the first surface 2$a$ of the wiring board 2 on which the semiconductor memory elements 43 and the controller element 63 are mounted. The semiconductor memory elements 43 and the controller element 63 are integrally sealed together with the metallic wires 47 and the like by the sealing resin layer 18. The slope portion 19 is formed at a leading end of the sealing resin layer 18, and a tab 20 is formed at its rear part. Thus, the semiconductor memory device 61 which is used as a semiconductor memory card is configured. The sealing resin layer 18 is not shown in FIG. 9.

The semiconductor memory device 61 configures solely a semiconductor memory card (e.g., micro SD™ card) without using a housing case such as a base card. Therefore, the sealing resin layer 18 and the like are in a state directly exposed outside. A cutout portion and a recess portion which indicate the forward and backward direction and the front and rear surface direction of the memory card and the slope portion 19 are formed on the semiconductor memory device 61 itself.

When the plural semiconductor memory elements 43 are stacked in the step-like shape, the semiconductor memory device 61 of the fourth embodiment applies the controller element 63 having the flip-chip connection structure and has the controller element 63 arranged below the overhang portion of the memory element group 45 stacked in the step-like shape. Thus, the connection of the controller element 63 is secured, and the number of the stacked semiconductor memory elements 43 can be increased. In other words, it becomes possible to provide a thin and high capacity semiconductor memory device 61.

It is preferable that the first through eighth semiconductor memory elements 43A to 43H configuring the memory element group 45 have a thickness in a range of 10 to 60 µm, excepting the lowermost first semiconductor memory element 43A. It is preferable that the first semiconductor memory element 43A which is in contact with the wiring board 2 has a thickness in a range of 50 to 150 µm similar to the first embodiment. In the fourth embodiment, eight semiconductor memory elements 43 are stacked without interposing a thick semiconductor element, spacer layer or the like for improving the wire bonding property, and the controller element 63 is further arranged on the wiring board 2. Therefore, even if the thickness of the semiconductor memory elements 43 is increased to be slightly larger than in the first and second embodiments, the thickness of the semiconductor memory device 61 can be satisfied.

For example, it is determined that the wiring board 2 has a thickness of 125 µm, the first semiconductor memory element 43A has a thickness of 60 µm, its adhesive layer has a thickness of 20 µm, the second through eighth semiconductor elements 43B to 43H each have a thickness of 45 µm, their adhesive layer has a thickness of 5 µm, and the sealing resin layer 18 has an on-element resin thickness of 145 µm. Then, a total thickness becomes 700 µm, which makes it possible to satisfy the card thickness TC (range of 700 to 740 µm) which is demanded for a micro SD™ card for example. The semiconductor memory elements 43 having a thickness of 20 to 60 µm is produced in the same manner as in the first embodiment.

In the semiconductor memory device 61 of the fourth embodiment, the mounted number (stacked number) of the semiconductor memory elements 43 is not limited to eight, but it is adequate if the number of the semiconductor memory elements 43 configuring the memory element group 45 is plural. But, in order to provide the semiconductor memory device 61 with high capacity, the number of the semiconductor memory elements 43 configuring the memory element group 45 is preferably eight or more. For example, when eight semiconductor memory elements 43 each having a storage capacity of 1 GB are used, an 8-GB micro SD™ card can be realized by the semiconductor memory device 61.

The semiconductor memory devices 41, 61 of the third and fourth embodiments are effective for a casing-less semiconductor memory card which is solely configured of them, but a semiconductor memory card using a casing such as a base card is not necessarily excluded. Besides, they can also be applied to a semiconductor memory device other than the semiconductor memory card. Specifically, they may be applied to a semiconductor memory device having a BGA package structure similar to the semiconductor packages shown in FIG. 5 and FIG. 6 or to a semiconductor memory device having an LGA package structure.

The semiconductor device and the semiconductor memory device of the present invention are not limited to the above-described embodiments but can be applied to various types of semiconductor memory devices which have plural semiconductor memory elements mounted by stacking on a wiring board. Specific structures of the semiconductor device and the semiconductor memory device of the present invention can be modified in various ways if the basic structure of the present invention is satisfied. In addition, the embodiments of the present invention can be expanded or modified within the scope of technical idea of the invention, and the expanded and modified embodiments are also included in the technical scope of the invention.

What is claimed is:

1. A semiconductor device, comprising:
    a wiring board having a first surface provided with an element mounting section and connection pads, and a second surface on a side opposite to the first surface;
    a first element group including a plurality of first semiconductor elements with first electrode pads arranged along one outline side, the first semiconductor elements being stacked in a step-like shape on the element mounting section of the wiring board with the outline sides directed to the same direction and the first electrode pads exposed;
    a second element group including a plurality of second semiconductor elements with second electrode pads arranged along one outline side, the second semiconductor elements being stacked in a step-like shape on the first element group with the outline sides directed to the same direction and the second electrode pads exposed;
    first metallic wires electrically connecting the first electrode pads and the connection pads of the wiring board;
    second metallic wires electrically connecting the second electrode pads and the connection pads of the wiring board; and
    a sealing resin layer formed on the first surface of the wiring board to seal the first and second element groups together with the first and second metallic wires,
    wherein the lowermost semiconductor element among the second semiconductor elements has a thickness larger than those of the other semiconductor elements among the second semiconductor elements, and
    wherein the second electrode pads are arranged on opposite sides of the second semiconductor elements from the wiring board, and a hollow portion is arranged below the lowermost semiconductor element among the second semiconductor elements corresponding to the second electrode pads of the lowermost semiconductor element.

2. The semiconductor device according to claim 1,
    wherein the second element group satisfies conditions $T1>T2$, $T1=50$ to $150\,\mu m$ and $T2=10$ to $50\,\mu m$, where T1 is a thickness of the lowermost semiconductor element, and T2 is a thickness of the other semiconductor element.

3. The semiconductor device according to claim 1,
    wherein the first element group satisfies conditions $T3>T4$, $T3=50$ to $150\,\mu m$ and $T4=10$ to $50\,\mu m$, where T3 is a thickness of the lowermost semiconductor element among the first semiconductor elements, and T4 is a thickness of the other semiconductor element among the first semiconductor elements.

4. The semiconductor device according to claim 1,
    wherein the first element group has four or more of the first semiconductor elements, and the second element group has four or more of the second semiconductor elements.

5. The semiconductor device according to claim 1,
    wherein the first element group has a plurality of semiconductor memory elements as the first semiconductor elements, and the second element group has a plurality of semiconductor memory elements as the second semiconductor elements.

6. The semiconductor device according to claim 5, further comprising:
    a controller element, stacked on the second element group, having electrode pads arranged along at least one outline side; and
    third metallic wires electrically connecting the electrode pads of the controller element and the connection pads of the wiring board.

7. The semiconductor device according to claim 5, further comprising:
    external connection terminals formed on the second surface of the wiring board.

8. A semiconductor device, comprising:
    a wiring board having a first surface provided with an element mounting section and connection pads, and a second surface on a side opposite to the first surface;
    a first element group including a plurality of first semiconductor elements with first electrode pads arranged along one outline side, the first semiconductor elements being stacked in a step-like shape on the element mounting section of the wiring board with the outline sides directed to the same direction and the first electrode pads exposed;
    a second element group including a plurality of second semiconductor elements with second electrode pads arranged along one outline side, the second semiconductor elements being stacked in a step-like shape on the first element group with the outline sides directed to the same direction and the second electrode pads exposed;
    first metallic wires electrically connecting the first electrode pads and the connection pads of the wiring board;
    second metallic wires electrically connecting the second electrode pads and the connection pads of the wiring board; and
    a sealing resin layer formed on the first surface of the wiring board to seal the first and second element groups together with the first and second metallic wires,
    wherein the second electrode pads are arranged on opposite sides of the second semiconductor elements from the wiring board, a hollow portion is arranged below the lowermost semiconductor element among the second semiconductor elements corresponding to the second electrode pads of the lowermost semiconductor element, and the second element group is disposed on the first element group via a spacer layer.

9. The semiconductor device according to claim 8,
    wherein the spacer layer includes an insulating resin layer which also serves as an adhesive layer.

10. The semiconductor device according to claim 8,
    wherein the spacer layer has a thickness larger than those of the first semiconductor elements.

11. The semiconductor device according to claim 8,
    wherein the spacer layer has a thickness larger than those of the second semiconductor elements.

12. The semiconductor device according to claim 9, wherein ends of the first metallic wires, which are connected to the uppermost semiconductor element among the first semiconductor elements, are buried in the insulating resin layer.

13. The semiconductor device according to claim 8, wherein the first element group has four or more of the first semiconductor elements, and the second element group has four or more of the second semiconductor elements.

14. The semiconductor device according to claim 8, wherein the first element group has a plurality of semiconductor memory elements as the first semiconductor elements, and the second element group has a plurality of semiconductor memory elements as the second semiconductor elements.

15. The semiconductor device according to claim 14, further comprising:
    a controller element, stacked on the second element group, having electrode pads arranged along at least one outline side; and
    third metallic wires electrically connecting the electrode pads of the controller element and the connection pads of the wiring board.

16. The semiconductor device according to claim 14, further comprising:
    external connection terminals formed on the second surface of the wiring board.

\* \* \* \* \*